United States Patent [19]

Guajardo

[11] Patent Number: 4,581,540
[45] Date of Patent: Apr. 8, 1986

[54] CURRENT OVERLOAD PROTECTED SOLID STATE RELAY

[75] Inventor: Ciro Guajardo, Harbor City, Calif.

[73] Assignee: Teledyne Industries, Inc., Los Angeles, Calif.

[21] Appl. No.: 627,808

[22] Filed: Jul. 5, 1984

Related U.S. Application Data

[63] Continuation-in-part of Ser. No. 590,184, Mar. 16, 1984.

[51] Int. Cl.⁴ .................................................. H02H 3/093
[52] U.S. Cl. ..................................... 307/117; 307/584; 361/93; 361/98; 361/100
[58] Field of Search ............... 361/86, 87, 91, 93, 361/98, 100, 101; 307/571, 575, 577, 584, 117

[56] References Cited

U.S. PATENT DOCUMENTS

| | | | |
|---|---|---|---|
| 4,227,098 | 10/1980 | Brown et al. | 307/584 X |
| 4,363,068 | 12/1982 | Burns | 361/100 X |
| 4,429,339 | 1/1984 | Jaeschke et al. | 361/93 |
| 4,453,193 | 6/1984 | Huang et al. | 361/93 X |
| 4,487,457 | 12/1984 | Janutka | 307/577 X |
| 4,509,102 | 4/1985 | Ayer | 361/101 X |

FOREIGN PATENT DOCUMENTS

| | | | |
|---|---|---|---|
| 3121754 | 12/1982 | Fed. Rep. of Germany | 361/101 |
| 45-19003 | 6/1970 | Japan | 361/101 |

*Primary Examiner*—Harry E. Moose, Jr.
*Attorney, Agent, or Firm*—Reagin & King

[57] ABSTRACT

A control circuit for protecting a metal oxide semiconductor field-effect power transistor from current overloads is disclosed in one embodiment of the control circuit. A silicon controlled rectifier is used to remove the bias voltage from the MOSFET in the event of a current overload. In another embodiment of the invention a bipolar transistor in combination with a second MOSFET is used to turn off the power MOSFET in the event of a current overload. The voltage appearing across the power MOSFET is used as an indication of a current overload condition.

3 Claims, 4 Drawing Figures

CURRENT OVERLOAD PROTECTED SOLID STATE RELAY

This application is a continuation-in-part of a Copending application Ser. No. 590,184, filed Mar. 16, 1984.

BACKGROUND OF THE INVENTION

This invention relates to solid state relays and, more particularly, to circuits for protecting solid state relays from damage caused by an output circuit current overload.

Over the years, a wide variety of solid state relays have been developed which use a power semiconductor as the output circuit switching device. Recently, some solid state relay circuits have been designed which employ metal oxide power semiconductor field-effect transistors (MOSFET's) as the output circuit switching device. Circuits of this type are disclosed in U.S. patent application Ser. No. 590,184, filed Mar. 16, 1984 and assigned to the assignee of the present application.

A major disadvantage to the use of many solid state relays is their lack of tolerance of current overloads in the output circuit. For example, even a brief short circuit across the load will usually result in catastrophic failure of the relay output circuit switching device.

Accordingly, it is an object of the present invention to provide a solid state relay which is not damaged by an output circuit current overload.

It is another object of the present invention to provide a circuit which automatically interrupts the flow of output circuit current in the event of an overload.

SUMMARY OF THE INVENTION

The foregoing and other objects of the invention are accomplished by a control circuit including a metal oxide semiconductor power field-effect transistor (MOSFET) having drain and source terminals which are connected to circuit output terminals. The output terminals are connected in series between a load and a power source.

A bias circuit is provided which generates a bias signal in response to the application of an input signal to circuit input terminals. The bias signal is applied to the gate and source terminals of the MOSFET and serves to bias it into conduction, thus applying power to the load.

Detector circuitry is provided which furnishes an indication of the level of load current flowing through the MOSFET. A shunting circuit responsive to the detector shunts the bias signal when the level of load current flowing through the MOSFET exceeds a predetermined value.

Other objects, features, and advantages of the invention will become apparent by reference to the specification taken in conjunction with the drawings in which like elements are referred to by like reference designations throughout the several views.

DESCRIPTION OF THE PREFERRED EMBODIMENT

Figure 1:
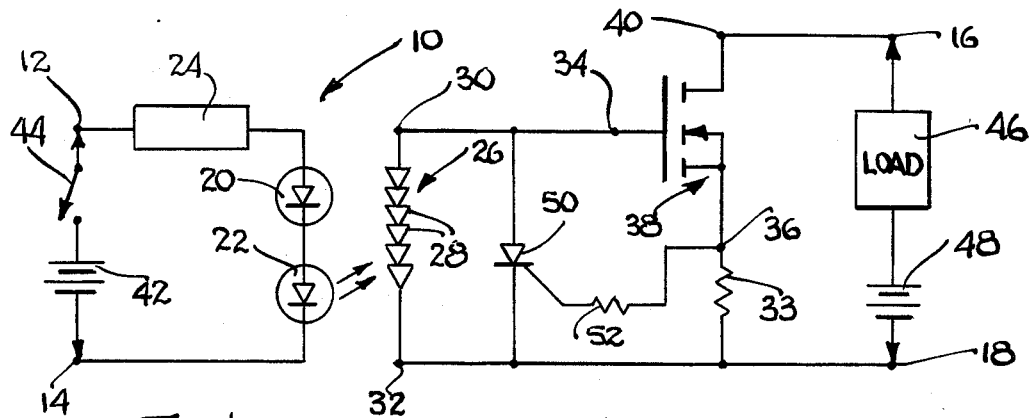
FIG. 1 is a schematic diagram showing a first embodiment of the invention in which a silicon controlled rectifier is used to shunt a bias signal from a MOSFET in the event of a current overload.

Referring to FIG. 1 there is shown a control circuit 10 constructed in accordance with a first embodiment of the invention. The circuit 10 includes a pair of input terminals 12 and 14 and a pair of output terminals 16 and 18.

Connected between the terminals 12 and 14 is a series circuit comprising first and second light emitting diodes (LED's) 20 and 22 and a current limiting element such as a resistor 24.

The LED's 20 and 22 are positioned adjacent to and optically coupled with a photodiode array 26 having positive and negative output terminals 30 and 32, respectively. The array 26 includes a plurality of photodiodes 28 connected in series to form a photovoltaic voltage source. It is well known to those skilled in the art that a photodiode will produce a voltage and a current (approximately one half a volt at about three microamperes for a small area silicon diode) in response to light impinging on the surface thereof. The amount of current available from a particular photodiode is proportional to the amount of light impinging on its surface.

By connecting in series a plurality of photodiodes 28, the voltages generated by each are added to produce a desired voltage level at the output terminals 30 and 32 of the array 26. In the preferred embodiment, sixteen photodiodes 28 are connected in series to produce an output voltage of about eight volts at a current level of about three microamperes in response to light from the LED's 20 and 22. The number of LED's used to illuminate the array 26 is a matter of design choice. The array 26 is typically fabricated as an integrated circuit device using manufacturing techniques such as dielectric isolation which are well known to those skilled in the art.

The positive terminal 30 of the array 26 is connected to the gate terminal 34 of an N-channel, enhancement mode metal oxide semiconductor field-effect power transistor (MOSFET) 38. The negative terminal 32 of the array 26 is connected through a resistor 33 to the source terminal 36 of the MOSFET 38, and the drain and source terminals 40 and 36 of the MOSFET 38 are in turn connected respectively to the circuit output terminals 16 and 18.

Power MOSFET's are characterized by their ability to switch several amperes of current between their output (drain and source) terminals from a power source of up to several hundred volts. These devices exhibit low output resistance in the on, or conducting, state (typically one-one hundredth to three ohms) and exhibit high output resistance in the off, or non-conducting, state (typically one to ten megohms). A typical MOSFET device for use in the invention is type number IRF520, supplied by International Rectifier, El Segundo, Calif.

The MOSFET 38 is biased into full conduction by the application of a first level of voltage (typically six to eight volts) between the gate and source terminals 34 and 36. The first level of voltage is referred to as the turn-on voltage of the MOSFET 38. When the gate to source voltage is below a second level of voltage (typically 3 volts) the MOSFET 38 is biased into a non-conducting state. This second level of voltage is referred to as the turn-off voltage of the MOSFET 38.

The operation of the circuit 10 as discussed thus far is as follows. An input signal is applied to the input terminals 12 and 14 by, for example, connecting a voltage source 42 across the terminals 12 and 14 using a switch 44 as shown in FIG. 1. In response to the input signal, the LED's 20 and 22 generate light. This light is optically coupled to the diode array 26 which causes it to produce a voltage across the gate and source terminals 34 and 36 of the MOSFET 38. The MOSFET 38 is biased into full conduction providing a low impedance current path across the output terminals 16 and 18. When the MOSFET 38 is conducting, power is applied to a load 46 from a power source 48. The load 46 and the source 48 are connected in series across the terminals 16 and 18 as shown in FIG. 1. When the switch 44 is opened, the LED's 20 and 22 no longer generate light. Consequently, the voltage provided by the array 26 drops to zero, and the MOSFET 38 turns off.

A disadvantage of the circuit just described is that it may be easily damaged due to output circuit current overloads. For example, in the event of a fault in the load 46, the level of current flowing through the MOSFET 38 may far exceed its current rating. The usual result is the catastrophic failure of the MOSFET 38. The circuit 10 is protected against such overloads in the following manner.

A silicon controlled rectifier (SCR) 50 is connected to act as a shunt across the diode array 26, where the anode and cathode terminals of the SCR 50 are connected, respectively, to the terminals 30 and 32 of the array 26. The gate terminal of the SCR 50 is connected to the source terminal 36 of the MOSFET 38 through a current limiting resistor 52.

Since the resistor 33 is in series with the load 46, the voltage appearing across the resistor 33 is proportional to the current flowing through the load 46, and hence, the MOSFET 38. The voltage appearing across the resistor 33 is applied to the gate of the SCR 50. When this voltage exceeds the gate turn-on voltage of the SCR 50 it is triggered into conduction, thereby shunting the voltage generated by the diode array 26.

As described earlier, when the switch 44 is closed, the array 26 generates a bias voltage which biases the MOSFET 38 into conduction, thus supplying current to the load 46 from the source 48. Under normal conditions, the current flowing throught the load 46 is within the current rating of the MOSFET 38. The value of the resistor 33 is chosen so that under this normal condition the voltage appearing across the resistor 33 is less than the turn-on voltage of the SCR 50. Accordingly, the SCR 50 remains in a nonconducting state. In the event of a current overload such as caused by a fault or short-circuit in the load 46, the current flowing through the MOSFET 38 will increase rapidly, as will the voltage appearing across the resistor 33. When that voltage reaches the turn-on voltage of the SCR 50, it switches into conduction, shunting the voltage generated by the array 26. This shunting effect causes the MOSFET 38 to immediately switch to the nonconducting state, hence terminating the flow of load current. The value of the resistor 33 is chosen so that the SCR 50 will not trigger when normal levels of current are flowing through the MOSFET 38, but will trigger when excessive current flows through the MOSFET 38. This excessive current level is chosen to be one which can be withstood by the MOSFET 38 for the brief interval of time (typically a few microseconds) required for the SCR 50 to conduct and to turn off the MOSFET 38.

After an overload condition has taken place, the circuit 10 may be reset to normal operation by opening the switch 44. This event stops the flow of current from the diode array 26, therefore allowing the SCR 50 to return to a nonconducting state. The circuit 10 is now reset and able to again respond to normal overload current conditions while protecting the MOSFET 38 from damage by current overloads.

Figure 2:
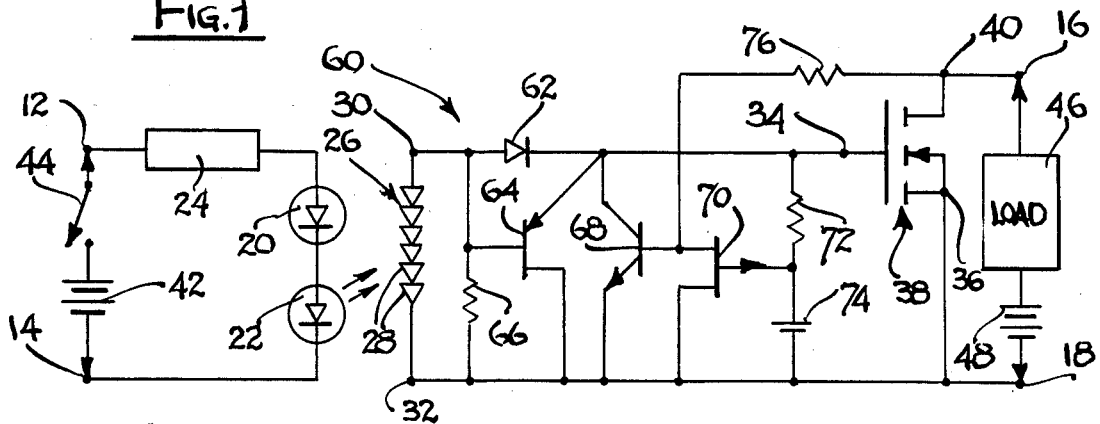
FIG. 2 is a schematic diagram showing a second embodiment of the invention in which a transistor is used to turn off the MOSFET in the event of a current overload.

FIG. 2 is a schematic diagram of a circuit 60 showing a second embodiment of the invention which does not employ the SCR 50 or the resistors 33 and 52 for overload protection. Additional differences between the circuit 60 and the circuit 10 are as follows. Connected between the terminal 30 of the array 26 and the gate terminal 34 of the MOSFET 38 is a diode 62 oriented to permit current flow toward the gate terminal 34. A PNP bipolar transistor 64 is provided having its emitter terminal connected to the gate terminal 34, its collector terminal connected to the source terminal 36 of the MOSFET 38, and its base terminal connected to the terminal 30 of the array 26. A resistor 66 is connected across the terminals 30 and 32 of the array 26. The operation of the components 62, 64 and 66 are described in detail in U.S. patent application Ser. No. 590,184, filed Mar. 16, 1984, and assigned to the assignee of the present application. The contents of that application are incorporated by reference herein. For purposes of understanding the present invention it is sufficient to understand that the PNP transistor 64 is biased into conduction between its emitter and collector terminals when the array 26 is not generating voltage. Conversely, the transistor 64 is biased into a nonconducting state when the array 26 is generating voltage. The transistor 64 acts to speed up the turn-off time of the MOSFET 38 by providing a discharge path for the capacitor associated with the gate-source elements of the MOSFET 38. The diode 62 couples the bias voltage from the array 26 to the gate 34 of the MOSFET 38. Accordingly, as in the previous embodiment 10, the MOSFET 38 responds to closures of the switch 44 by switching into a conducting state. When the switch 44 is opened, the MOSFET 38 switches to a nonconducting state in an extremely short interval of time, due in part to the conduction of the transistor 64.

The circuit 60 provides protection for current overloads in the following manner. An NPN bipolar transistor 68 is provided having a collector terminal connected to the gate terminal 34 of the MOSFET 38, and an emitter terminal connected to the source terminal 36 of the MOSFET 38. A depletion mode junction FET (JFET) 70 is provided with its drain terminal connected to the base terminal of the transistor 68. The source terminal of the JFET 70 is connected to the source terminal 36 of the MOSFET 38. A resistor 72 is connected between the gate terminals of the the JFET 70 and the MOSFET 38, and a capacitor 74 is connected between the gate and source terminals of the JFET 70. A resistor 76 is connected between the drain terminals of the MOSFET 38 and the JFET 70.

The resistor 76 provides a bias signal to the base of the transistor 68 which is proportional to the voltage appearing across the drain and source terminals 40 and 36 of the MOSFET 38. This voltage is a measure of the current flowing through the MOSFET 38. This is so because the MOSFET 38, when it is in the conducting state, appears as a very low value resistor between its drain and source terminals 40 and 36, and therefore the voltage drop appearing between these two terminals is proportional to the current flowing through the MOSFET 38. The circuit 60 makes use of the fact that the voltage drop across the MOSFET 38 is proportional to its current in order to measure this current level.

With normal current flowing through the MOSFET 38, the voltage across it is less than the base to emitter turn-on voltage of the transistor 68. Hence, there is sufficient bias voltage applied to the base of the resistor 68 through the resistor 76 to cause the transistor 68 to conduct. Under current overload conditions, however, the voltage appearing at the drain terminal 40 with respect to the source terminal 36 increases significantly. When that voltage exceeds the base to emitter turn-on voltage of the transistor 68, it begins conducting. When the transistor 68 conducts, it shunts the voltage from the array 26, causing the MOSFET 38 to turn off. This turn off action is regenerative because as the transistor 68 begins to conduct, the MOSFET 38 begins to turn off, hence the voltage at the terminal 40 rises dramatically. This rise provides additional current to the base of the transistor 68, forcing it further into conduction. The result is that the MOSFET 38 rapidly switches off in the event of a current overload.

When the MOSFET 38 is in the nonconducting state, either because the switch 44 is open or because a current overload has just occurred, the voltage at the drain terminal 40 is essentially the voltage of the power source 48. This voltage is sufficient to keep the transistor 68 biased in the conducting state, hence preventing the array 26 from providing a base voltage to turn the MOSFET 38 back on. The elements 70, 72 and 74 are employed to overcome this turn-on problem.

As described previously, with the switch 44 open, the array 26 does not generate any voltage and the PNP transistor 64 conducts. Conduction of the transistor 64 causes discharge of the capacitor 74 through the resistor 72. With the capacitor 74 fully discharged, the JFET 70 is in a conducting state. Conduction of the JFET 70 effectively shunts the base emitter junction of the transistor 68 preventing it from conducting. When the switch 44 is first closed, the voltage from the array 26 acts to charge the capacitor 74 through the resistor 72. Until the capacitor 74 charges to the turn off voltage of the JFET 70, the transistor 68 is prevented from conducting.

In effect, the resistor 72 and the capacitor 74 form a time delay circuit preventing the transistor 68 from conducting until the MOSFET 38 has switched into the conducting state. Assuming the load current to the MOSFET 38 is within the normal range, when the MOSFET 38 is fully conducting, the voltage across it will not be sufficient to turn on the transistor 68. Of course, as described above, the transistor 68 can be biased into conduction under excessive load current conditions.

After an overload condition has taken place, the circuit is reset by opening the switch 44 which, through the transistor 64, causes the capacitor 74 to discharge, thus resetting the time delay circuit and permitting the circuit 60 to respond normally to subsequent closures of the switch 44.

Figure 3:
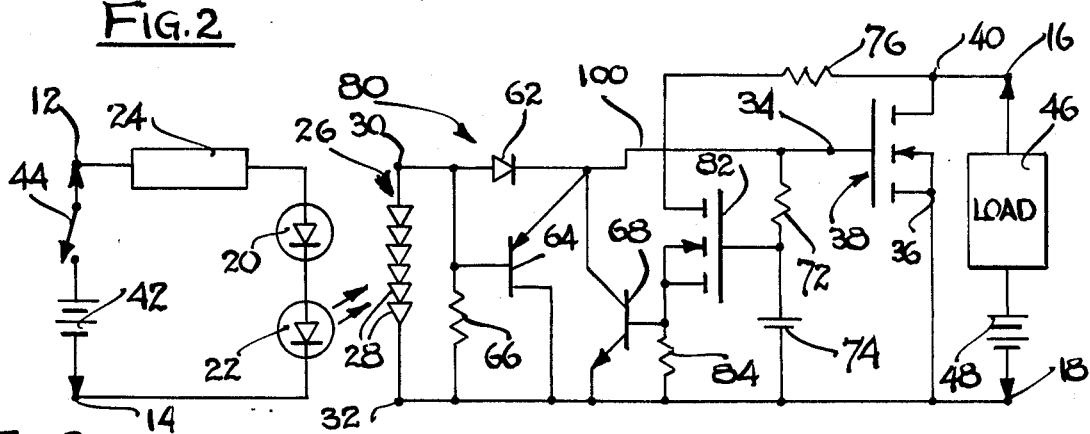
FIG. 3 is a schematic diagram showing a third embodiment of the invention in which a second MOSFET is added to the circuit of FIG. 2 in order to eliminate a current path around the first MOSFET when it is not conducting.

FIG. 3 is a schematic diagram showing a circuit 80 constructed in accordance with a third embodiment of the invention. The circuit 80 is substantially identical to the circuit 60 except for the addition of a second MOSFET 82 and a resistor 84 in place of the JFET 70. The MOSFET 82 is connected between the resistor 76 and the base of the transistor 68, with the drain terminal of the MOSFET 82 being connected to the resistor 76 and the source terminal connected to the base terminal of the transistor 68. The gate terminal of the MOSFET 82 is connected to the junction between the resistor 72 and the capacitor 74. The resistor 84 is connected between the base and emitter terminals of the transistor 68.

The addition of the MOSFET 82 eliminates a leakage current path between the output terminals 16 and 18 caused by the resistor 76 in the circuit 60. Referring briefly to FIG. 2, it will be seen that when the MOSFET 38 is in a nonconducting state, the leakage path exists through the resistor 76 and the base emitter junction of the transistor 68. This path causes a small amount of current to flow through the load 46 when the MOSFET 38 is nonconducting. In certain applications, this leakage current is undesirable.

Referring to FIG. 3, the MOSFET 82 is biased into conduction when a voltage appears across the capacitor 74. This capacitor voltage is provided by the array 26 through the resistor 72. With the switch 44 open and the MOSFET 38 non-conducting, there is no voltage across the capacitor 74, and hence, the MOSFET 82 is not conducting. Under this condition, no current flows through the resistor 76, thus alleviating the leakage current problem. When the switch 44 is closed, the voltage from the array 26 charges up the capacitor 74 until the MOSFET 82 switches into conduction. As described previously, the resistor 72 and capacitor 74 are chosen so that the MOSFET 82 does not begin conducting until the MOSFET 38 has fully switched into conduction. With the MOSFET 82 in the conducting state, the voltage across the MOSFET 38 is provided to the base of the transistor 68 through the resistors 76 and 84. The value of the resistor 84 may be chosen to adjust the level of current overload at which the transistor 68 switches into conduction.

Figure 4:
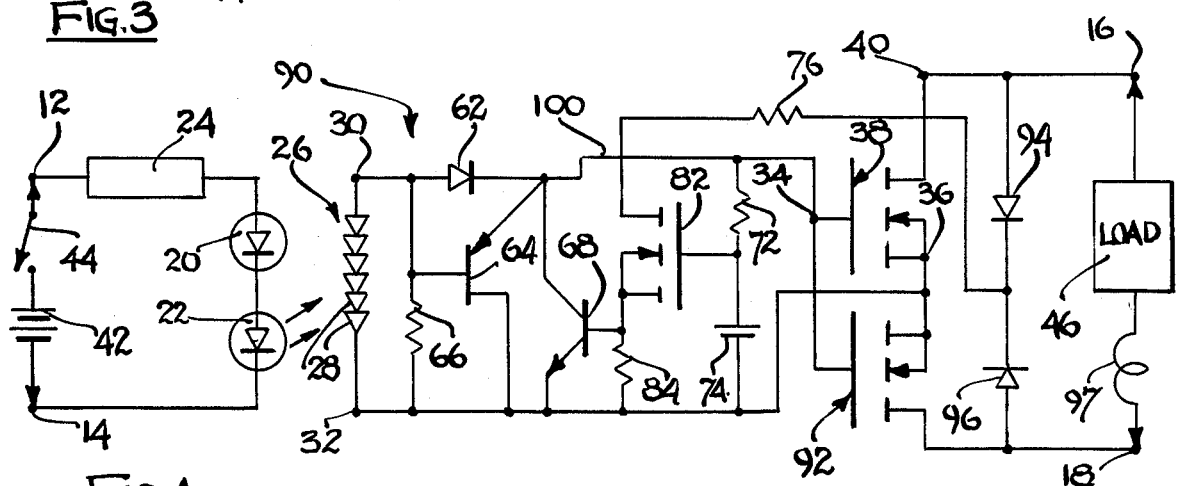
FIG. 4 is a schematic diagram showing a fourth embodiment of the invention in which the circuit of FIG. 3 is combined with a third MOSFET to provide current overload protection for a switching configuration having bi-directional load current carrying capability.

FIG. 4 is a schematic diagram of a circuit 90 showing a fourth embodiment of the invention. The circuit 90 is substantially similar to the circuit 80, but employs a MOSFET 92 in combination with the MOSFET 38 to provide bidirectional conduction of current through the output terminals 16 and 18. The differences between the circuit 90 and the circuit 80 are as follows. The MOSFET 92, which is similar in construction to the MOSFET 38, is connected with its source terminal in common with the source terminal 36 of the MOSFET 38. The drain terminal of the MOSFET 92 is, in turn, connected to the output terminal 18. The gate terminal of the MOSFET 92 is connected to the gate terminal 34 of the MOSFET 38. Diodes 94 and 96 are provided where the anode of the diode 94 is connected to the output terminal 16, and the anode of the diode 96 is connected to the output terminal 18. The cathode terminals of the diodes 94 and 96 are connected together and to the resistor 76.

The MOSFETS 38 and 92 provide a bidirectional current path between the output terminals 16 and 18 which enables the circuit 90 to control a load 46 powered by an alternating current power source 97. The voltage from the array 26 is used to simultaneously control the two power MOSFETS. The steering diodes 94 and 96 provide, through the resistor 76, an indication of the current flowing through either the MOSFET 38 or the MOSFET 92. Accordingly, if a current overload condition exists, regardless of the direction of the flow of the current, this event will be detected via the diodes 94 and 96 and the resistor 76. This event will appear as an increase in the voltage appearing across either the MOSFET 38 or the MOSFET 92, depending upon the direction of overload current flowing through the output terminals 16 and 18. In either event, the transistor 68 will be switched into conduction turning off both MOSFET's 38 and 92. As in the circuit 80, the circuit 90 is reset by opening the switch 44.

For some applications of the circuits 80 and 90, it has been found desirable to include a resistor in line 100 between the gate terminal 34 and the collector terminal of the transistor 68, and to include a capacitor in parallel with the resistor 72. These two additional components form a filter which prevents the occurrence of parasitic oscillations, particularly when these circuits are used at low temperatures. In other applications, all or part of the resistor 84 may be replaced with a thermistor having a negative temperature coefficient. The effect of this replacement is to compensate for component temperature variations so that the overload current level at which the circuits switch off is held fairly constant over a wide range of temperatures.

While the invention is disclosed and particular embodiments thereof are described in detail, it is not intended that the invention be limited solely to these embodiments. Many modifications will occur to those skilled in the art which are within the spirit and scope of the invention. It is thus intended that the invention be limited in scope only by the appended claims.

What is claimed is:

1. An electronic control circuit having input and output terminals, comprising:
   a metal oxide semiconductor field-effect transistor (MOSFET) having a gate terminal and drain and source terminals;
   means for connecting the drain and source terminals to the output terminal;
   bias means for providing a bias signal in response to the application of an input signal to the circuit;
   means for connecting the bias means to the gate and source terminals of the MOSFET so that the bias signal serves to bias the MOSFET into conduction when the level of current flowing through the MOSFET exceeds a predetermined value;
   detector means for providing an indication of the level of current flowing through the MOSFET;
   shunt means responsive to the detector means for shunting the bias signal when the level of current flowing through the MOSFET exceeds a predetermined value; and where the shunt means includes a transistor having base, emitter and collector terminals, and means for connecting the emitter and collector terminals to the source and gate terminals, respectively, of the MOSFET;
   the detector means includes a first resistor and means for connecting the first resistor between the drain terminal of the MOSFET and the base terminal of the transistor, and delay means for delaying the application of current flowing through the first resistor to the base terminal of the transistor,
   the delay means including a junction field-effect transistor (JFET) having source, drain and gate terminals, means for connecting the drain terminal to the base terminal of the transistor, means for connecting the source terminal to the emitter terminal of the transistor, a second resistor, means for connecting the second resistor between the gate terminal of the MOSFET and the gate terminal of the JFET, a capacitor, and means for connecting the capacitor between the gate and source terminals of the JFET.

2. An electronic control circuit having input and output terminals, comprising:
   a metal oxide semiconductor field-effect transistor (MOSFET) having a gate terminal and drain and source terminals;
   means for connecting the drain and source terminals to the output terminal;
   bias means for providing a bias signal in response to the application of an input signal to the circuit;
   means for connecting the bias means to the gate and source terminals of the MOSFET so that the bias signal serves to bias the MOSFET into conduction when the level of current flowing through the MOSFET exceeds a predetermined value;
   detector means for providing an indication of the level of current flowing through the MOSFET;
   shunt means responsive to the detector means for shunting the bias signal when the level of current flowing through the MOSFET exceeds a predetermined value; and where the shunt means includes a transistor having base, emitter and collector terminals, and means for connecting the emitter and collector terminals to the source and gate terminals, respectively, of the MOSFET;
   the detector means includes a first resistor and means for connecting the first resistor between the drain terminal of the MOSFET and the base terminal of the transistor, and delay means for delaying the application of current flowing through the first resistor to the base terminal of the transistor, and
   in which the detector means further includes a second resistor, and means for connecting the second resistor between the base and emitter terminals of the transistor;
   the means for connecting the first resistor includes a second MOSFET, and means for connecting the second MOSFET between the first resistor and the base terminal of the transistor; and
   the delay means includes a series circuit comprising a third resistor and a capacitor, means for connecting the series circuit between the gate and source terminals of the first MOSFET, and means for connecting the gate terminal of the second MOSFET to the junction between the third resistor and the capacitor.

3. An electronic control circuit having input and output terminals, comprising:
   a metal oxide semiconductor field-effect transistor (MOSFET) having a gate terminal and drain and source terminals;
   means for connecting the drain and source terminals to the output terminal;
   bias means for providing a bias signal in response to the application of an input signal to the circuit;
   means for connecting the bias means to the gate and source terminals of the MOSFET so that the bias signal serves to bias the MOSFET into conduction when the level of current flowing through the MOSFET exceeds a predetermined value;

detector means for providing an indication of the level of current flowing through the MOSFET;

shunt means responsive to the detector means for shunting the bias signal when the level of current flowing through the MOSFET exceeds a predetermined value; and further including a second MOSFET, means for connecting the second MOSFET between the source terminal of the first MOSFET and one output terminal, the drain terminal of the second MOSFET is connected to the one output terminal, and the source terminals of the first and second MOSFET's are connected together;

where the detector means further detects when the current flowing through either MOSFET exceeds the predetermined value and generates the shutdown signal in response thereto, and in which the shunt means includes a transistor having base, emitter and collector terminals, means for connecting the emitter and collector terminals to the source and gate terminals, respectively, of the first and second MOSFET's, a resistor, and means for connecting one end of the resistor to the drain terminals of the first and second MOSFET's and the other end of the resistor to the base terminal of the transistor, including first and second diodes, means for connecting the anode terminals of the first and second diodes to the drain terminals of the first and second MOSFET's, respectively, and means for connecting the cathode terminals of the first and second diodes to the one end of the resistor.

* * * * *